United States Patent
Schuler et al.

(10) Patent No.: US 8,552,524 B2
(45) Date of Patent: Oct. 8, 2013

(54) SEMICONDUCTOR COMPONENT WITH TRENCH INSULATION AND CORRESPONDING PRODUCTION METHOD

(75) Inventors: Franz Schuler, Dresden (DE); Georg Tempel, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 644 days.

(21) Appl. No.: 10/523,239

(22) PCT Filed: Jul. 19, 2003

(86) PCT No.: PCT/DE03/02435
§ 371 (c)(1),
(2), (4) Date: Sep. 28, 2005

(87) PCT Pub. No.: WO2004/017401
PCT Pub. Date: Feb. 26, 2004

(65) Prior Publication Data
US 2006/0102978 A1 May 18, 2006

(30) Foreign Application Priority Data
Jul. 22, 2002 (DE) .................................. 102 33 208

(51) Int. Cl.
*H01L 29/00* (2006.01)
*H01L 21/8238* (2006.01)

(52) U.S. Cl.
USPC ............ 257/510; 257/E21.572; 257/E21.548; 438/221

(58) Field of Classification Search
USPC .......... 257/505, 508, 510, E21.548, E21.549, 257/E21.572
See application file for complete search history.

(56) References Cited

U.S. PATENT DOCUMENTS

| 4,454,647 A * | 6/1984 | Joy et al. ....................... 438/361 |
| 4,528,047 A | 7/1985 | Beyer et al. |
| 4,666,556 A | 5/1987 | Fulton et al. |
| 5,236,863 A | 8/1993 | Iranmanesh |

(Continued)

FOREIGN PATENT DOCUMENTS

| JP | 63-276263 | 11/1988 |
| JP | 63-289853 | 11/1988 |

(Continued)

OTHER PUBLICATIONS

Office Action (Translation of Notice of Reasons for Refusal) in the Japanese Patent Office for corresponding JP Application No. 2004-528395.

(Continued)

*Primary Examiner* — Julio J Maldonado
*Assistant Examiner* — Sarah Salerno

(57) ABSTRACT

The invention relates to a semiconductor component with trench isolation and to an associated fabrication method, a trench isolation having a deep isolation trench with a covering insulation layer, a side wall insulation layer and an electrically conductive filling layer, which is electrically connected to a predetermined doping region of the semiconductor substrate in a bottom region of the trench. The use of a trench contact, which has a deep contact trench with a side wall insulation layer and an electrically conductive filling layer, which is likewise electrically connected to the predetermined doping region of the semiconductor substrate in a bottom region of the contact trench, makes it possible to improve the electrical shielding properties with a reduced area requirement.

6 Claims, 12 Drawing Sheets

(56) References Cited

U.S. PATENT DOCUMENTS

| | | | |
|---|---|---|---|
| 5,675,173 A * | 10/1997 | Kawai et al. | 257/508 |
| 6,214,696 B1 * | 4/2001 | Wu | 438/424 |
| 6,218,725 B1 * | 4/2001 | Jeon | 257/574 |
| 6,251,734 B1 | 6/2001 | Grivna et al. | |
| 6,277,709 B1 * | 8/2001 | Wang et al. | 438/430 |
| 6,607,959 B2 * | 8/2003 | Lee et al. | 438/296 |
| 6,720,638 B2 * | 4/2004 | Tran | 257/499 |
| 6,888,214 B2 * | 5/2005 | Mouli et al. | 257/510 |
| 2001/0005022 A1 | 6/2001 | Ogura | |
| 2002/0014676 A1 | 2/2002 | Marty et al. | |
| 2002/0076879 A1 * | 6/2002 | Lee et al. | 438/241 |
| 2002/0081809 A1 | 6/2002 | Pinto et al. | |
| 2003/0199136 A1 * | 10/2003 | Kim et al. | 438/238 |

FOREIGN PATENT DOCUMENTS

| | | |
|---|---|---|
| JP | 02152252 A | 6/1990 |
| JP | 07048515 A | 2/1995 |
| JP | 2000-269317 | 9/2000 |
| JP | 2001-110890 | 4/2001 |
| JP | 2001185721 A | 7/2001 |
| JP | 2001291863 A | 10/2001 |

OTHER PUBLICATIONS

Office Action (translation of Notification of Reasons for Refusal) from corresponding Japanese Patent Application No. 2010-094488.
English language abstract of JP 2001-291863 A.
English language abstract of JP 07-048515 A.
English language abstract of JP 02-152252 A.

* cited by examiner

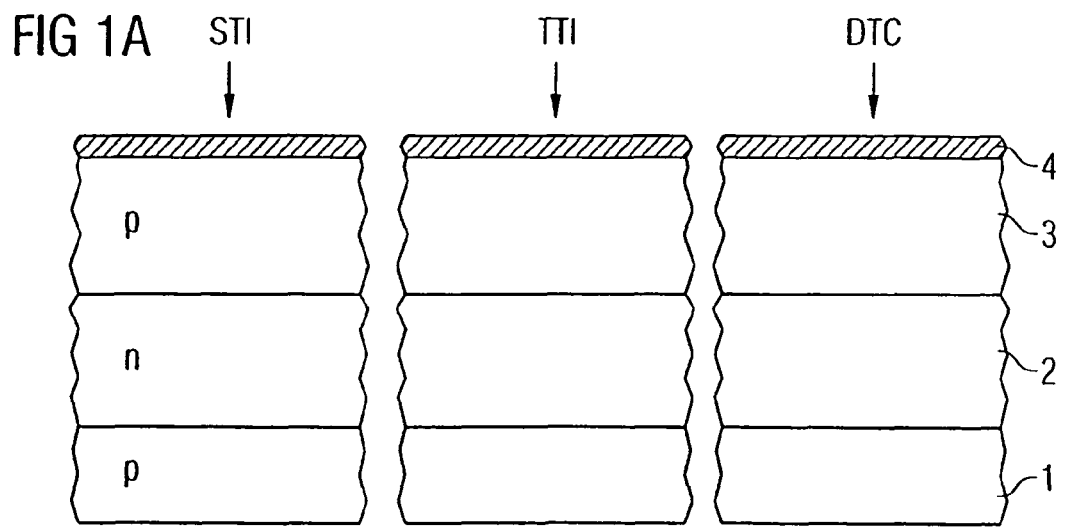
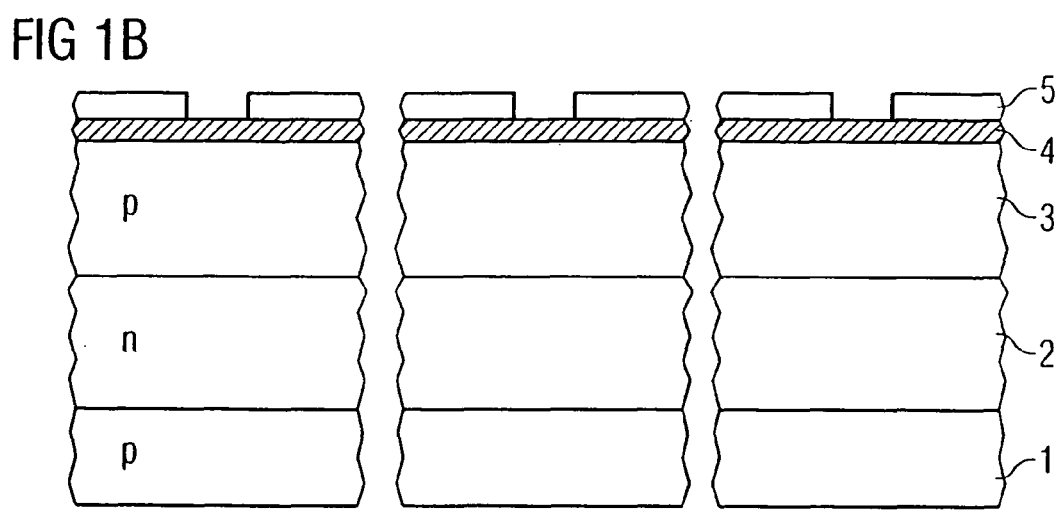
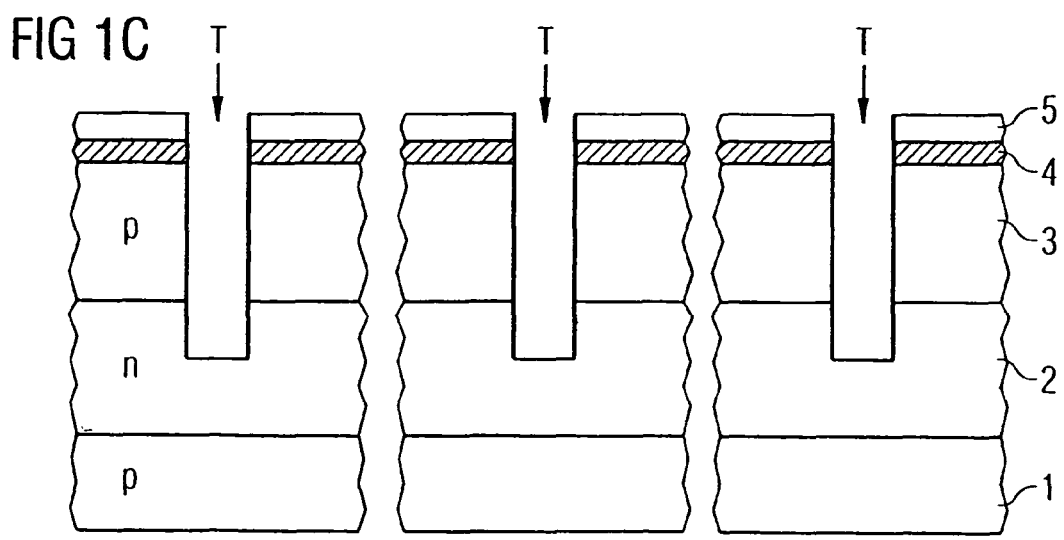

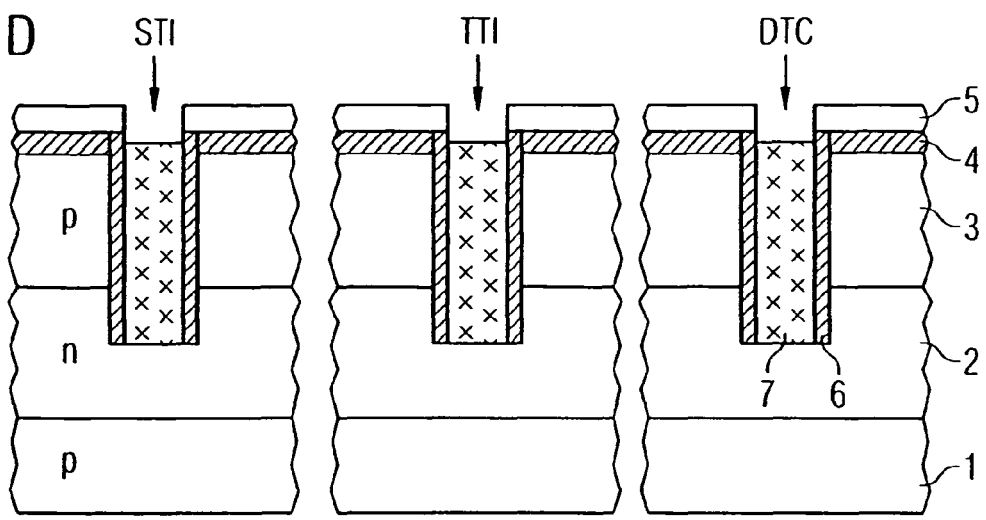
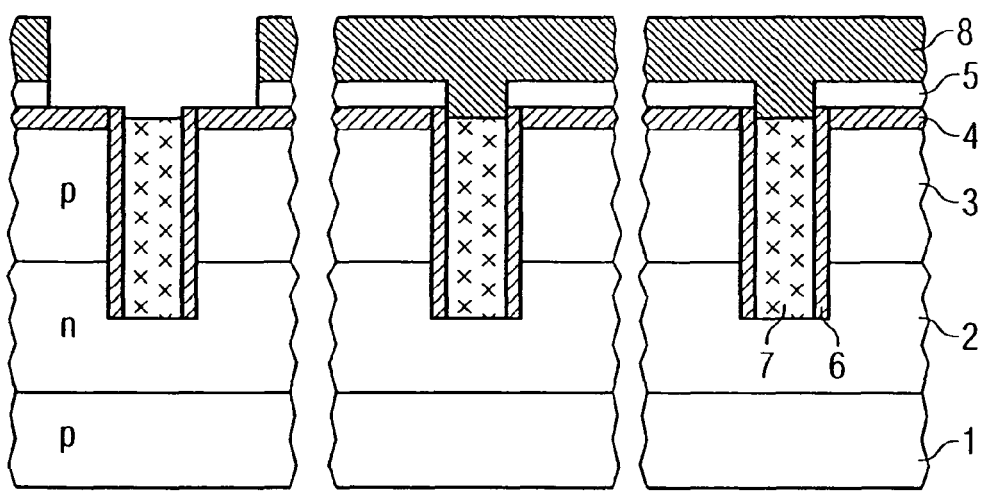
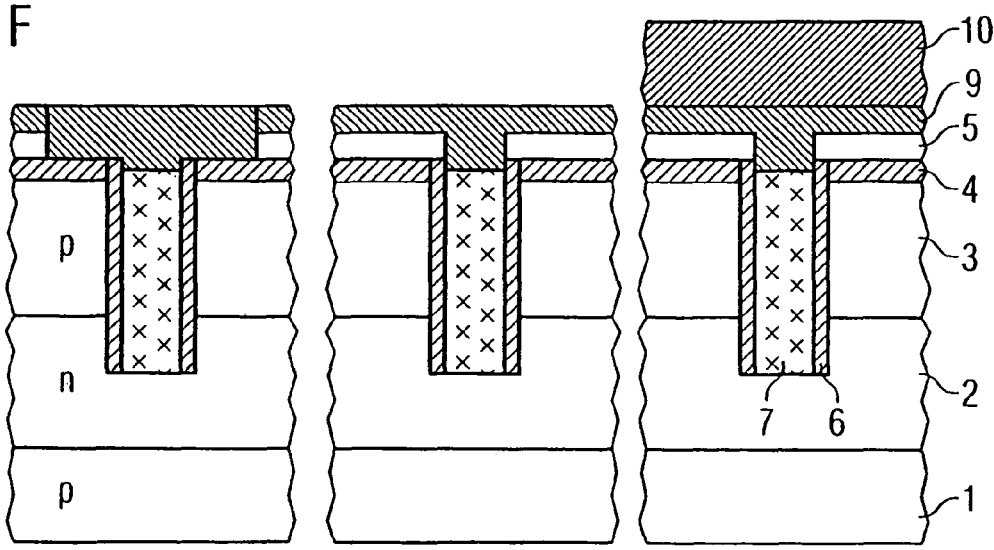

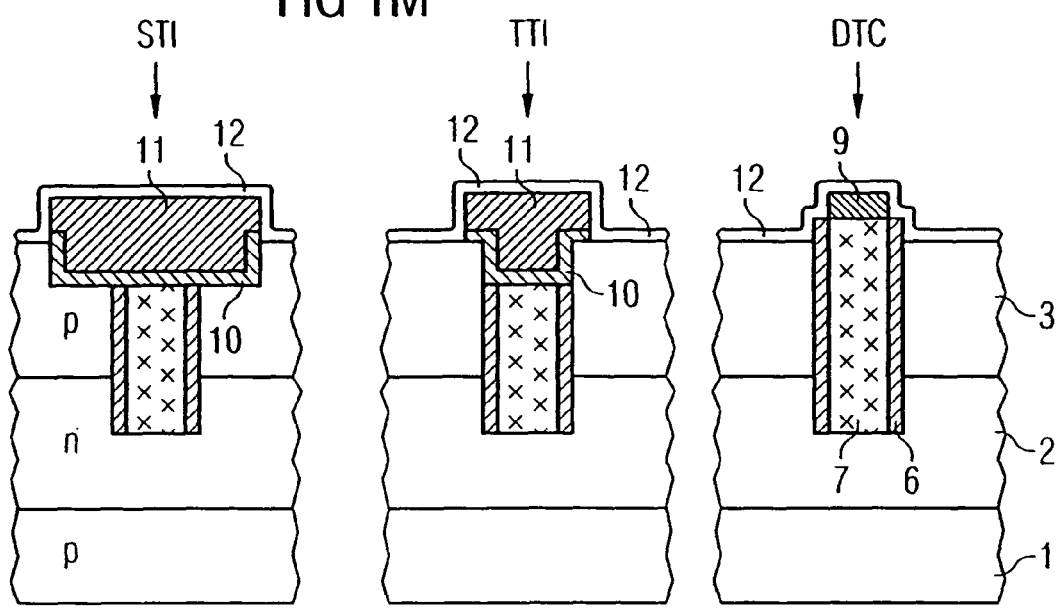
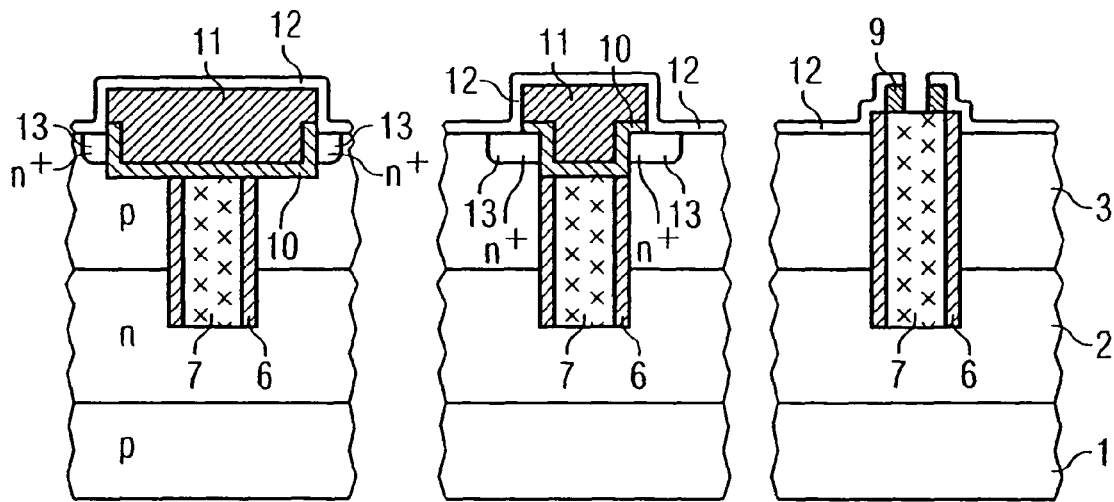

SEMICONDUCTOR COMPONENT WITH TRENCH INSULATION AND CORRESPONDING PRODUCTION METHOD

This application claims benefit of priority to German Patent Application No. DE 10233208.8, filed Jul. 22, 2002.

The present invention relates to a semiconductor component with trench isolation and to an associated fabrication method, and, in particular, to a semiconductor component with a trench-type, bottom-contact-connected active shielding and to an associated fabrication method.

Isolations for defining, in particular, active regions in semiconductor substrates have usually been formed by thick oxide films, so-called local oxidation regions (LOCOS, Local Oxidation of Silicon). As the integration density rises, however, such conventional LOCOS methods are no longer suitable since they have a high area requirement. What is more, they exhibit the so-called "birds beak" phenomenon, with insulation layers forming laterally in the direction of the active regions. Therefore, so-called trench isolations have been developed, in which case, for example in accordance with shallow trench isolation (STI), a shallow isolation trench filled with insulating material is formed at the surface of a semiconductor substrate. Nevertheless, such a conventional trench isolation is also often insufficient since so-called punch-through effects occur in the semiconductor material. Undesirable leakage currents are observed in this case. In the extreme case, parasitic bipolar transistors may be triggered by these leakage currents and semiconductor components may therefore be destroyed.

Trench isolations with a shielding structure have recently been developed in particular for the purpose of reducing such leakage currents, in which case, in order to realize a field shielding in the trench, an electrically conductive material is embedded as electrode and leads to improved electrical properties. Such trench isolations with shielding action are usually contact-connected at the substrate surface or from the substrate.

What are disadvantageous in this case, however, are an inadequate shielding action and/or an increased area requirement on account of the necessary contact connection.

Therefore, the invention is based on the object of providing a semiconductor component with trench isolation and an associated fabrication method, it being possible to realize not only an improved shielding but also a reduced area requirement and thus an improved integration density.

BRIEF SUMMARY

According to the invention, this object is achieved by means of the features of patent claim 1 with regard to the semiconductor component.

In particular through the use of a special trench contact, which has a deep contact trench with a side wall insulation layer and an electrically conductive filling layer, which is electrically connected to a predetermined doping region of the semiconductor substrate in a bottom region of the contact trench, and via which a trench isolation with active shielding is contact-connected, substrate resistances, in particular, can be significantly reduced, as a result of which improved shielding properties are obtained. At the same time, the use of the trench contact makes it possible to significantly reduce an area requirement for a respective semiconductor circuit.

Preferably, a covering insulation layer of the trench isolation is situated below the semiconductor substrate surface and within the isolation trench, which results in particular in an improved further processability on account of the relatively even surface and an insulation of the conductive trench filling from conductive layers, such as e.g. interconnects, possibly lying above the covering insulation layer.

Preferably, the trench isolation and the trench contact are formed with a depth in the semiconductor substrate which is larger than a depth of a respective depletion zone, as a result of which punch-through effects, in particular, can be reduced.

If widened or so-called shallow isolation trenches are used at the semiconductor substrate surface of the respective trench isolation, then unrequired or non-active regions of a semiconductor substrate can be passivated in a simple manner using conventional standard methods.

Preferably, the semiconductor substrate has a multiple well structure, the predetermined doping region constituting a doping well situated therein, as a result of which optimally adapted shieldings can be realized even in the case of complex semiconductor circuits. In particular, a contact connection of well regions is significantly improved in this case since a contact connection that has been made uniform is made possible and potential fluctuations within a well are reduced. On the other hand, it is possible to significantly reduce an area requirement since respective well contacts now no longer have to be routed to a semiconductor substrate surface.

Further advantageous refinements of the invention are characterized in the further subclaims.

The invention is described in more detail below using exemplary embodiments with reference to the drawing.

DETAILED DESCRIPTION

First Exemplary Embodiment

Figure 1G:
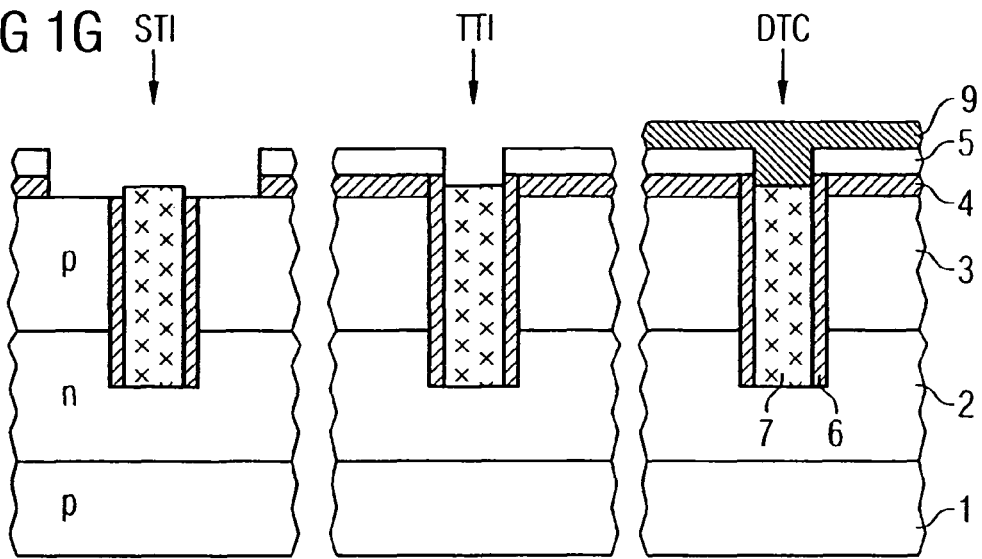
FIGS. 1A to 1N show simplified sectional views for illustrating essential method steps in the fabrication of a semiconductor component with trench isolation in accordance with a first exemplary embodiment.

FIGS. 1A to 1N show simplified sectional views of a semiconductor component with a—in an upper region—widened but shallow trench isolation STI, a—in its upper region—thin trench isolation TTI and an associated trench contact DTC (Deep Trench Contact) in accordance with a first exemplary embodiment.

In accordance with FIG. 1A, firstly different doping regions are formed in a common carrier material such as e.g. a semiconductor substrate, the reference symbol 1 for example representing a p-type semiconductor substrate or a deep p-type well, the reference symbol 2 an n-type well and the reference symbol 3 a (shallow) p-type well. The wells or doping regions 1, 2 and 3 may be formed for example by means of ion implantation or other doping methods, silicon preferably being used as semiconductor material.

By way of example, a first insulation layer 4 in the form of an oxide layer is deposited or grown at the surface of the semiconductor substrate. A double or triple well structure is obtained in this way in the semiconductor substrate and can be used to realize complex semiconductor circuits and, in particular, NMOS and PMOS transistors. In order to realize high-voltage circuits, the wells may be formed with corresponding high-voltage dopings.

In accordance with FIG. 1B, a hard mask layer 5 is subsequently formed at the surface of the first insulation layer 4 for example by means of a deposition method, e.g. $Si_3N_4$ being deposited. A patterning by means of conventional lithographic methods is subsequently effected in order to form a corresponding hard mask for deep trenches T that are to be formed later.

In accordance with FIG. 1C, deep trenches T are formed using the patterned hard mask or hard mask layer 5 by means of e.g. an anisotropic etching method in respective regions for a trench isolation with shallow but widened surface region STI, a thin trench isolation TTI and a trench contact DTC. By way of example, the anisotropic etching method used may be a reactive ion etch (RIE), as a result of which very deep and exactly patternable trenches with the same depth are formed in the semiconductor substrate.

In particular when using a trench structure, the deep trenches being situated only within a well or an identically doped substrate, in order to avoid so-called punch-through effects, the depth of the trenches is larger than a depth of an associated depletion zone of doping regions that are formed or are to be formed later at the surface.

In accordance with FIG. 1C, the deep trenches T extend right into a predetermined doping region or a predetermined doping well 2, which, by way of example, constitutes a middle N-type well of a triple well structure.

In accordance with FIG. 1D, the formation of the deep trenches T is then followed by the formation of a side wall insulation layer 6 at the side walls of the trenches T, in which case firstly, after cleaning for the removal of the dry etching polymers, a trench insulation layer is formed at the surface of the trench T. This trench insulation layer is preferably formed as a so-called liner oxide by means of a thermal oxidation method, an anisotropic reactive ion etch, for example, being carried out in order to remove a bottom region of the trench insulation layer. After the removal of the bottom region of the trench insulation layer, thereby completing the side wall insulation layer 6, the trench is filled with an electrically conductive material 7, a highly doped polysilicon, for example, being deposited whose doping has the same conduction type n as the predetermined doping region or the n-type well 2. Finally, the electrically conductive filling layer 7 is subjected to an anisotropic etching-back step, for example, as a result of which the sectional view illustrated in FIG. 1D is obtained.

In accordance with FIG. 1E afterward a resist layer 8 is formed at the surface of the semiconductor substrate and of the filled trenches and is correspondingly patterned in order to realize a widened surface trench STI at least in this region and the structure is transferred to the underlying hard mask layer 5. In this way, a conventional shallow trench isolation can be formed in semiconductor regions to be passivated, as a result of which even large area regions can be deactivated in a simple manner.

In accordance with FIG. 1F afterward the first resist layer 8 is removed or stripped and a second insulation layer 9 is formed over the whole area, preferably a silicon dioxide hard mask layer (e.g. TEOS) being deposited by means a CVD method (Chemical Vapor Deposition). Afterward, a second resist layer 10 is formed over the whole area and patterned by means of conventional photolithographic methods in such a way that only the trench isolations STI and TTI are uncovered and the region for the trench contact DTC continues to be protected.

In accordance with FIG. 1G, the deposited second insulation layer 9 is then removed in the regions for the trench isolations STI and TTI, in which case conventional etching methods can be used, and the second resist layer 10 is then removed or stripped, as a result of which the sectional view illustrated in FIG. 1G is obtained.

Figure 1H:
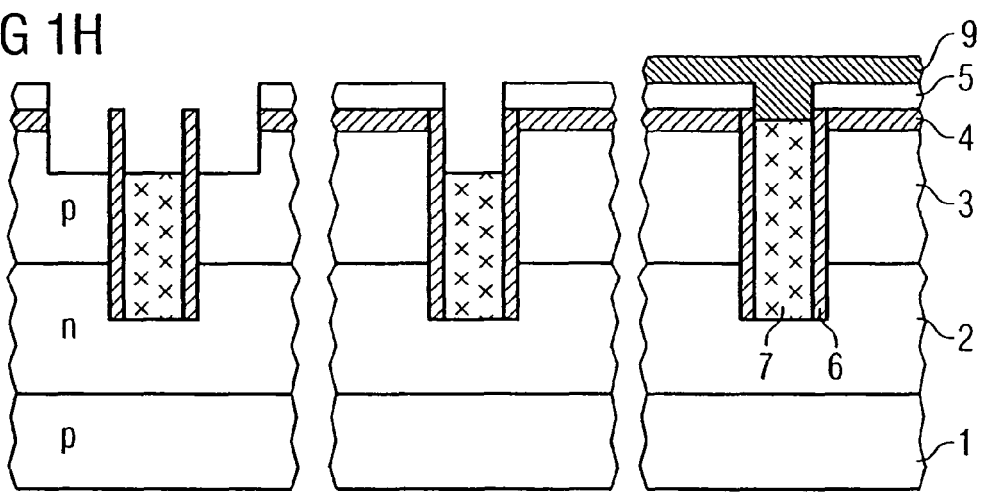

In accordance with FIG. 1H, a further etching method is then effected using the hard mask layer 5 in the regions of the trench isolations STI and TTI and the second insulating layer 9 in the region of the trench contact DTC, both the semiconductor material or silicon of the topmost p-type well 3 and an upper region of the electrically conductive filling layer 7 or of the highly doped polysilicon being removed preferably by means of an anisotropic etching method. This is preferably done by means of a reactive ion etch. A cleaning process is then effected, in which the polymers arising during the previous dry etching method are also removed, inter alia.

Figure 1I:
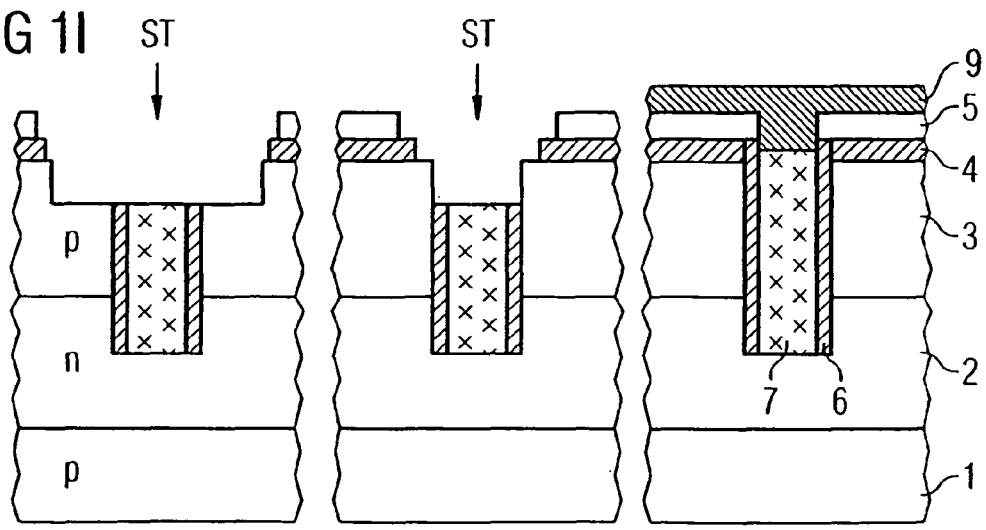

Since the side wall insulation layer 6 remains in particular in the widened trench isolation STI with shallow and widened surface region, by way of example, an HF dip for removing the residual side wall insulation layer 6 is carried out in a subsequent step in accordance with FIG. 1I. In this way, in the regions of the trench isolation STI and TTI, the side wall insulation layers 6 are removed in an upper region of the deep trench T, as a result of which shallow and partly widened trenches ST are obtained. Furthermore, in accordance with FIG. 1I, the edges of the hard mask layer 5 can also be etched back in the uncovered regions of the trench isolations STI and TTI, which is referred to as so-called "Nitride Pullback". This results in a certain stress relief of the trench edges for the further processing and also improved electrical properties of CMOS transistors that are likewise present, for example.

Figure 1J:
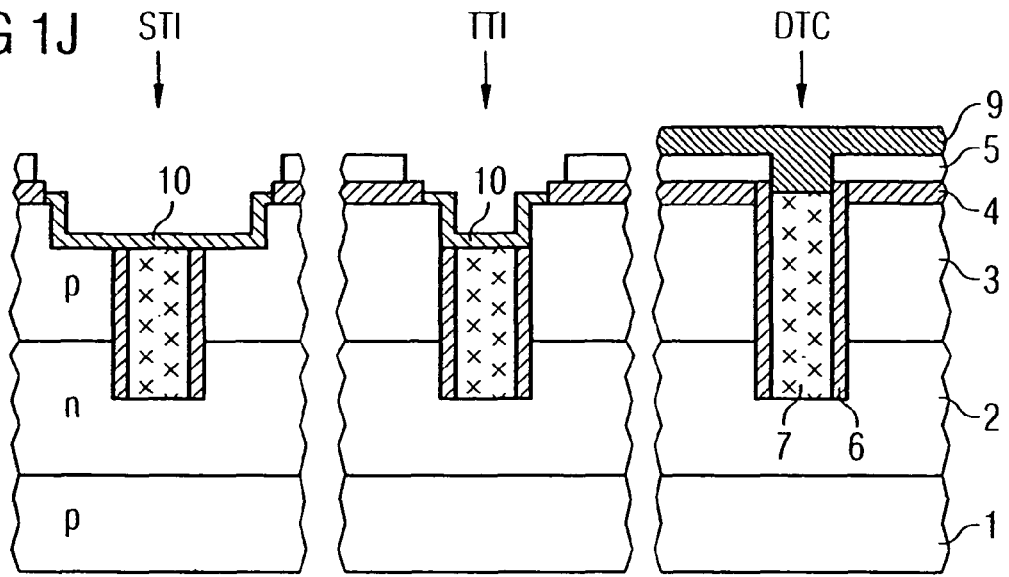

In accordance with FIG. 1J, a first covering insulation partial layer 10 is subsequently formed in the shallow trenches ST of the trench isolation regions STI and TTI that have been formed, which partial layer preferably forms a so-called liner oxide as insulation layer conformally once again by means of a thermal oxidation. In the same way, however, it is also possible to carry out alternative methods for forming this insulation layer (such as e.g. layer structures).

Figure 1K:
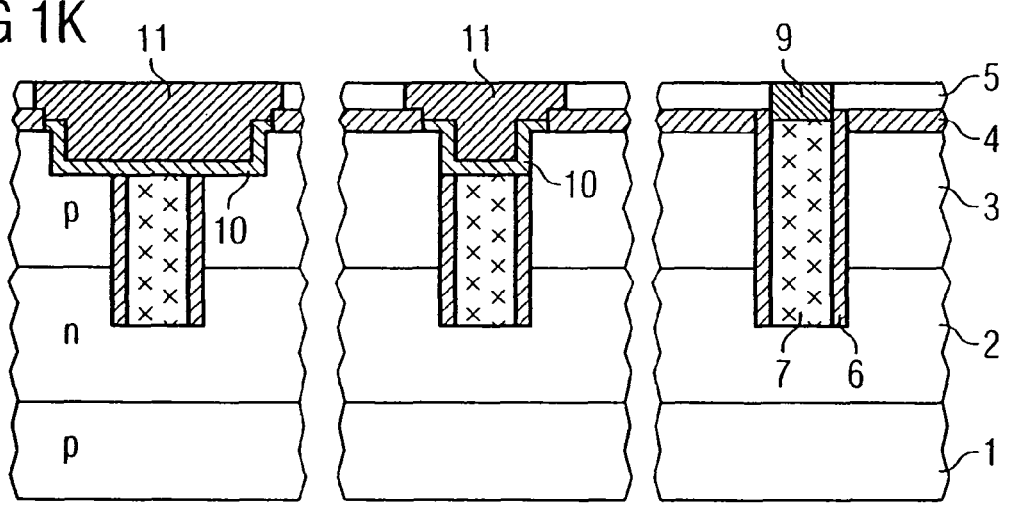

In accordance with FIG. 1K, a second covering insulation partial layer 11 is subsequently formed in the shallow trench ST or at the surface of the first covering insulation partial layer 10, a CVD deposition of $SiO_2$ (e.g. TEOS) preferably being carried out. The shallow trenches ST are completely filled in this way. In order to planarize the second covering insulation partial layer 11 deposited in this way, by way of example, a conventional CMP method (chemical mechanical polishing) is carried out, the hard mask layer 5 being used as a stop layer. Accordingly, during this step, the second insulation layer 9 is also removed in the region of the trench contacts DTC, as a result of which the sectional view illustrated in FIG. 1K is obtained.

Figure 1L:
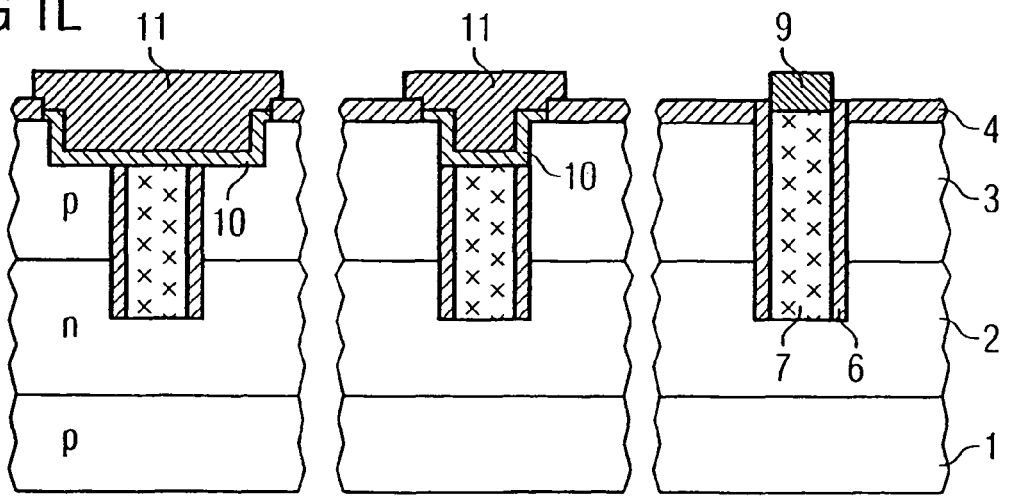

In accordance with FIG. 1L, the hard mask layer 5 or the silicon nitride layer is then removed over the whole area, as a result of which only the first insulation layer 4, the second insulation layer 9 and the second covering insulation partial layer 11 remain on the semiconductor substrate. A particularly simplified method step is obtained in this case in particular with the use of silicon dioxide for these layers.

In a subsequent method step, in accordance with FIG. 1M, the residual first insulation layer 4, also referred to as a silicon dioxide buffer layer, is removed, in which case the second insulator layer 9 and the second covering insulation partial layer 11 are also correspondingly removed and should have corresponding thicknesses in order to avoid short circuits or unintentional topographies.

Afterwards, a gate oxide layer is formed as gate dielectric 12, for example by means of thermal oxidation, it being possible for this gate dielectric 12 also to be formed by means of alternative methods and alternative materials. The actual formation of switching elements in the active regions of the semiconductor substrate or the p-type well 3 is then usually effected, FIG. 1N merely indicating n+-doped doping regions 13. In the region of the trench contact DTC, from this point in time, a contact opening for making contact with the deep n-type well 2 via the electrically conductive filling layer 7 is also uncovered by means of conventional methods. The further fabrication methods for forming NMOS or PMOS transistors are not illustrated in this case since they correspond to conventional fabrication steps.

A semiconductor component with trench isolation that is contact-connected at the bottom side is obtained in this way, said trench isolation having an improved shielding action since, in particular, contact resistances in the predetermined doping regions or the n-type well 2 can be kept minimal and, moreover, an area requirement for contact connection from above can be obviated. More precisely, an optimum connection possibility can be found through suitable positioning of the trench contact DTC in the predetermined doping region 2 with respect to each trench isolation situated therein. On account of the covering insulation layers 10 and 11 sunk in the trenches, it is possible, moreover, to prevent undesirable topographies, as a result of which a further-reaching processing can be simplified. Furthermore, by means of the method steps illustrated in FIGS. 1A to 1N, both very narrow trench isolations TTI and thus high integration densities and widened trench isolations STI at the surface can be formed and connected effectively as active shieldings in the semiconductor substrate, as a result of which not only is it possible to realize a very small area requirement for active components but also active regions that are not desired or required can be deactivated without difficulty by means of the widened trench isolations STI.

In the case of the multiple well structure illustrated in FIG. 1N, in particular, it is possible, accordingly, to realize even very complex semiconductor circuits with an extraordinarily high integration density since punch-through effects and leakage currents are reliably prevented.

Second Exemplary Embodiment

Figure 2:
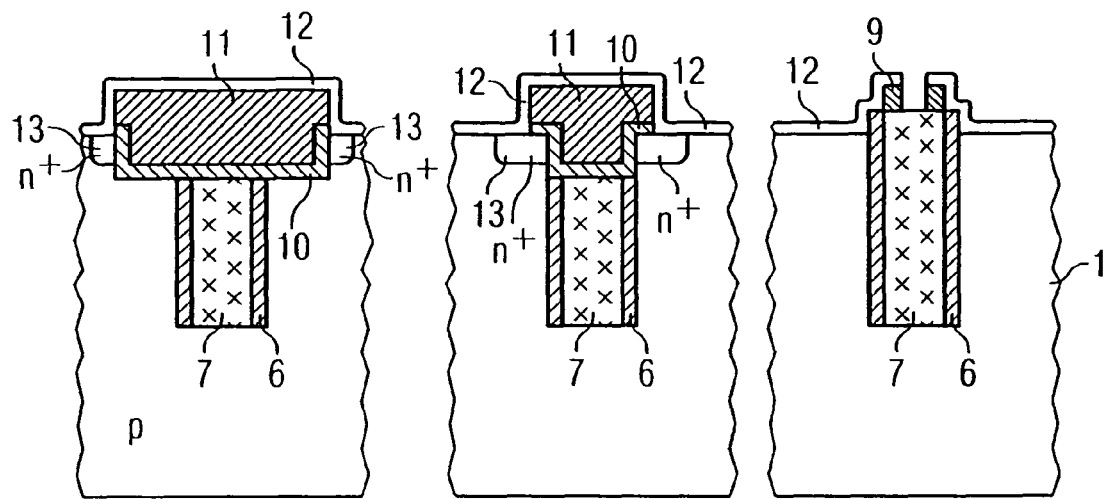
FIG. 2 shows a simplified sectional view for illustrating a semiconductor component with trench isolation in accordance with a second exemplary embodiment.

FIG. 2 shows a simplified sectional view of a semiconductor component with trench isolation in accordance with a second exemplary embodiment, identical reference symbols designating elements or layers identical or corresponding to those in FIG. 1, for which reason a repeated description is dispensed with below.

In accordance with FIG. 2, however, the semiconductor component may not only be formed in a semiconductor substrate with a multiple well structure, but rather may have merely a single doping, as a result of which, in particular for greatly simplified semiconductor circuits, improved shielding properties are likewise obtained with a reduced area requirement. The semiconductor component illustrated in FIG. 2 is an NMOS transistor, for example, a p-type semiconductor substrate 1 being used and, consequently, a $p^+$-doped semiconductor material being used as electrically conductive filling layer. An improved connection possibility for the trench isolations that are contact-connected at the bottom side is once again obtained on account of the trench contacts DTC used, thus resulting in an improved shielding with a reduced area requirement. In the case of such simple semiconductor substrates, in particular, a depth of the trenches should be larger than a depth of the depletion zones produced by the doping regions 13, in order to effectively prevent a so-called punch-through effect.

Furthermore, it should be pointed out that, particularly when using highly doped polycrystalline semiconductor materials as electrically conductive filling layer 7, an outdiffusion takes place at the foot of the contact during the subsequent process steps (not illustrated), as a result of which further improved insulating properties can be produced.

Third Exemplary Embodiment

Figure 3:
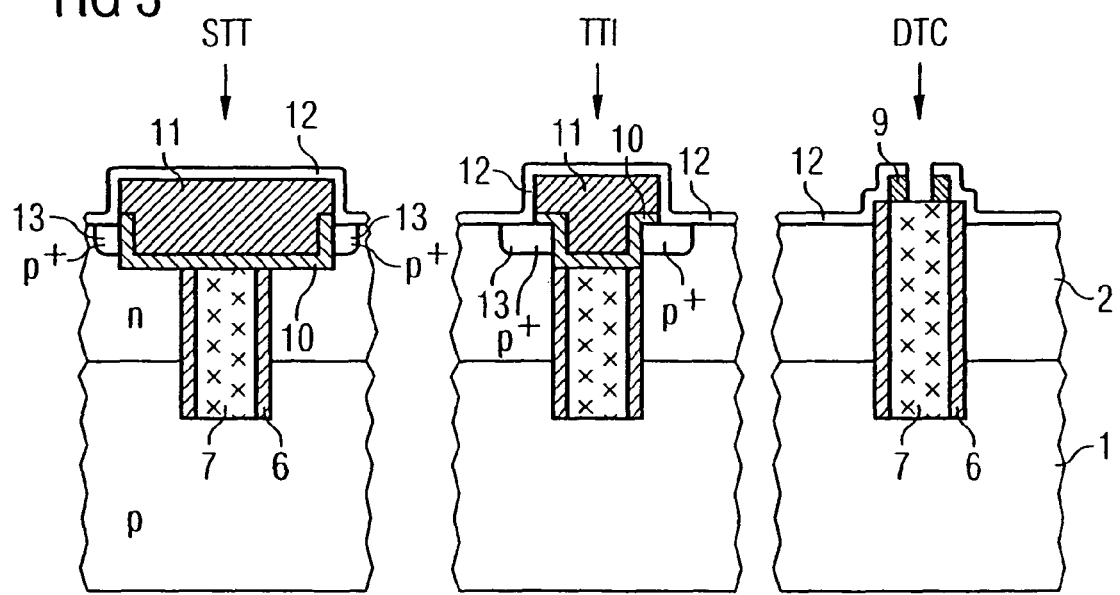
FIG. 3 shows a simplified sectional view for illustrating a semiconductor component with trench isolation in accordance with a third exemplary embodiment.

FIG. 3 shows a simplified sectional view of a semiconductor component with trench isolation in accordance with a third exemplary embodiment, identical reference symbols designating elements or layers identical to those in FIG. 1 or 2 and a repeated description being dispensed with below.

In accordance with FIG. 3, the semiconductor substrate now has only a p-type well or an actual substrate 1 and an additional n-type well 2, the electrically conductive filling layer 7 being connected to the p-type well or the substrate 1. This yields an STI and TTI trench isolation for PMOS transistors, for which reason the doping regions 13 are $p^+$-doped. Particularly when using highly doped semiconductor material, the electrically conductive filling layer is accordingly composed of a $p^+$-doped polysilicon.

Improved shielding properties with a reduced area requirement again result in accordance with the first and secondary exemplary embodiment.

Fourth Exemplary Embodiment

Figure 4:
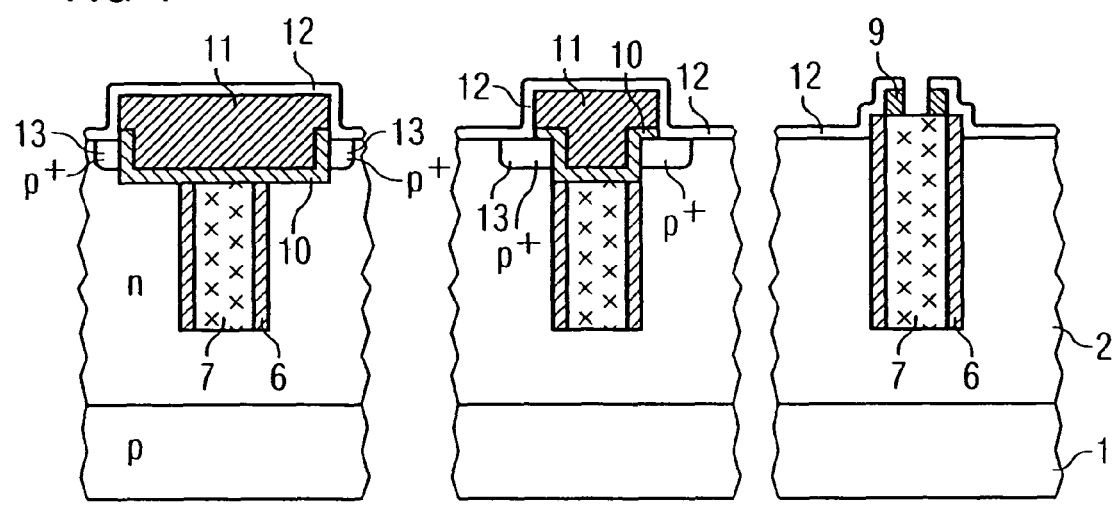
FIG. 4 shows a simplified sectional view for illustrating a semiconductor component with trench isolation in accordance with a fourth exemplary embodiment.

FIG. 4 shows a simplified sectional view of a semiconductor component with trench isolation in accordance with a fourth exemplary embodiment, identical reference symbols again designating elements or layers identical to those in FIGS. 1 and 3 and a repeated description being dispensed with below.

An STI and TTI trench isolation with associated trench contact DTC for PMOS transistors is again known in accordance with FIG. 4, a double well structure or an n-type well 2 in a p-type substrate 1 now being formed again. In accordance with FIG. 4, the bottom-side connection of the trench isolation may accordingly also be situated in the first n-type well 2, in which case once again preferably $n^+$-doped polysilicon is used and, in order to avoid punch-through effects, a corresponding depth of the trenches is larger than a depth of the space charge zones.

Once again improved shielding properties with a reduced area requirement for semiconductor components with trench isolations can be produced in this case, too, it being possible to fabricate simultaneously both narrow trench isolations TTI and trench isolations with a widened trench surface STI.

Fifth Exemplary Embodiment

FIGS. 5A to 5H show simplified sectional views for illustrating essential method steps in the fabrication of a semiconductor component with trench isolation in accordance with a fifth exemplary embodiment, identical reference symbols designating layers or elements identical or corresponding to those in FIGS. 1 to 4 and a repeated description being dispensed with below.

In accordance with the fifth exemplary embodiment, now only a widened trench isolation STI with a widened surface structure and an associated trench contact DTC are formed, as a result of which the method steps can be slightly simplified.

Firstly, however, the same method steps as in FIGS. 1A to 1D are again effected, as a result of which a side wall insulation layer 6 and an electrically conductive filling layer 7 are formed in deep trenches T.

Figure 5A:
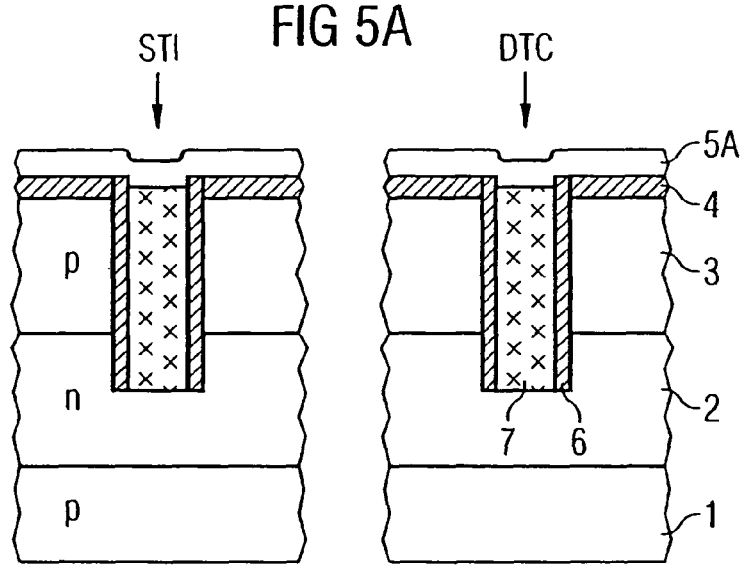
FIGS. 5A to 5H show simplified sectional views for illustrating essential method steps in the fabrication of a semiconductor component with trench isolation in accordance with a fifth exemplary embodiment.

In a method step in accordance with FIG. 5A, which follows the method step in accordance with FIG. 1D, the hard mask layer 5, preferably comprising a silicon nitride layer, is then completely removed and a new second hard mask layer 5A is deposited over the whole area, by way of example.

Figure 5B:
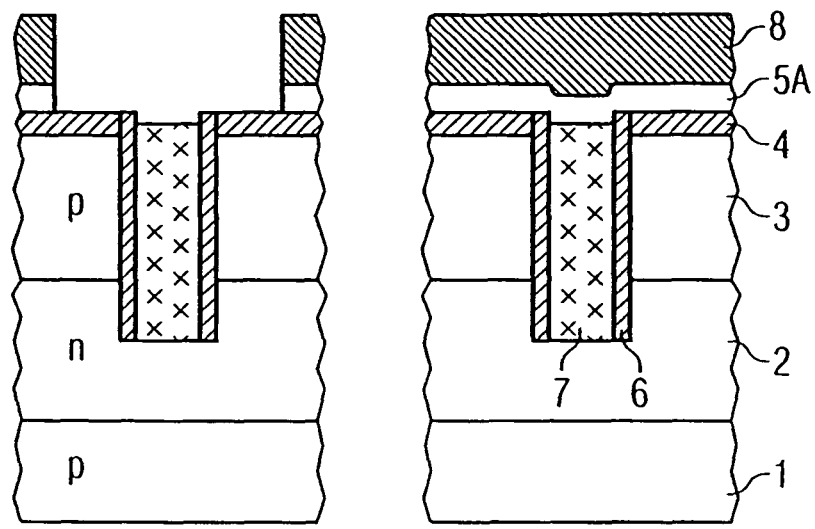

In accordance with FIG. 5B, in a subsequent method step, once again a first resist layer 8 for patterning the region for the widened trench isolation STI is applied and patterned by means of conventional photolithographic methods. Using this resist mask, the second hard mask layer 5A is subsequently removed in particular in the region of the widened trench isolation STI, as a result of which the sectional view illustrated in FIG. 5B is obtained.

Figure 5C:
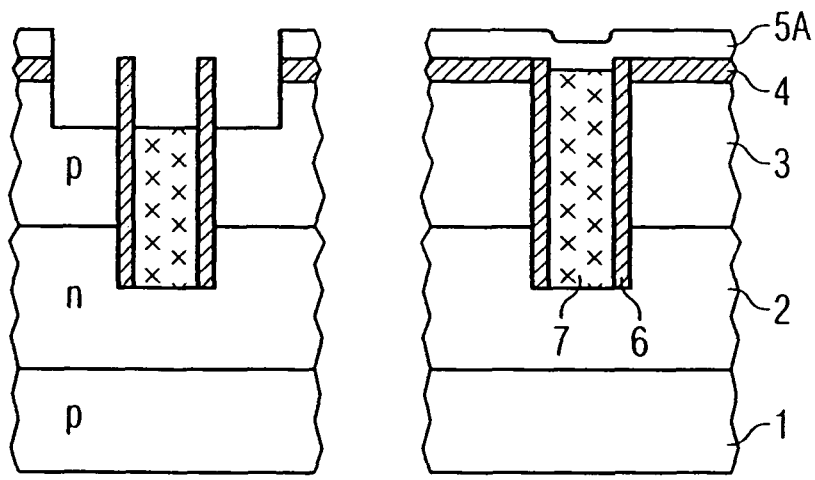

In accordance with FIG. 5C, afterward the first resist layer 8 is removed or a resist stripping is effected and the electrically conductive filling layer 7 and the semiconductor substrate or the p-type well 3 are removed in an upper region of the trenches. This step essentially corresponds to the method step in accordance with FIG. 1H of the first exemplary embodiment, firstly the first insulating layer or silicon dioxide buffer layer 4 and then the semiconductor material being removed. This step is once again concluded by a cleaning process or by the removal of the residual polymers.

Figure 5D:
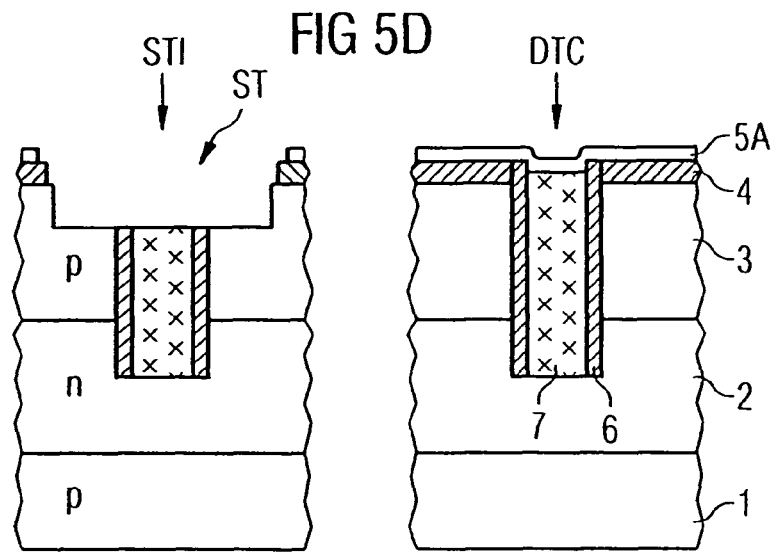
Figure 5E:
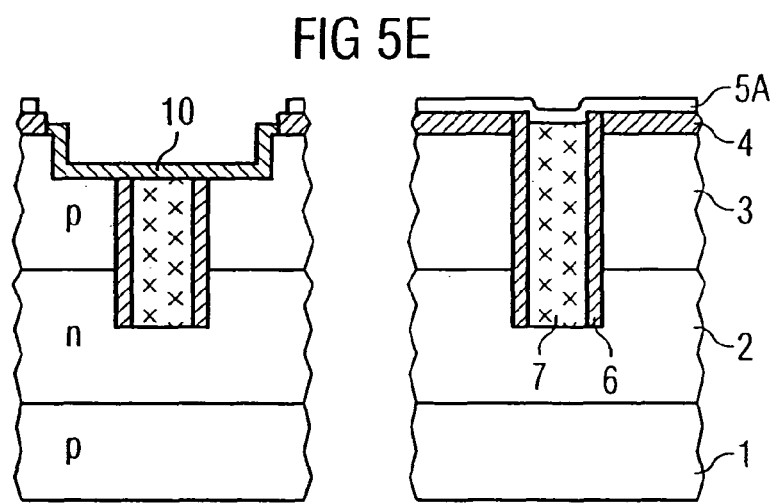

In accordance with FIG. 5D, in the same way as in the step in accordance with FIG. 1I, a brief dipping into hydrofluoric acid (HF dip) is carried out, as a result of which the residual silicon dioxide side wall insulation layers 6 are removed. Furthermore, for the stress relief of the trench edges, an etching-back of the second hard mask layer 5A is carried out, which is referred to as so-called nitride fallback and leads to an etching-back or thickness reduction of this layer in the region of the trench contacts DTC as well.

Figure 5F:
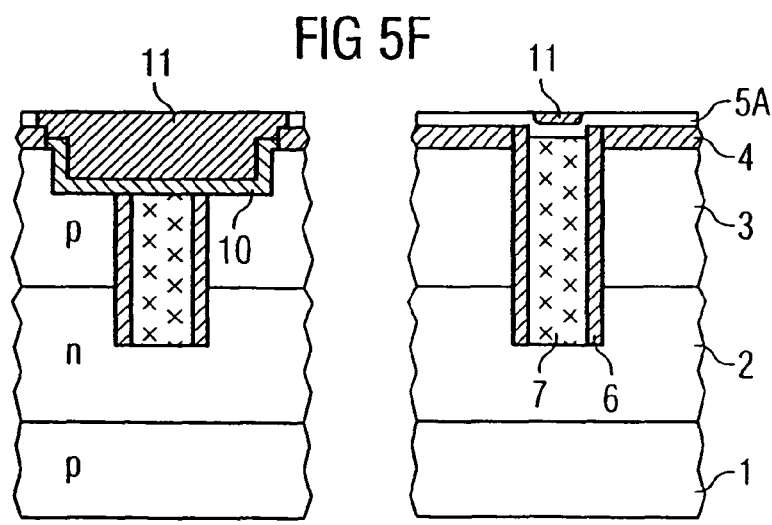

In accordance with FIG. 5E, once again the first covering insulation partial layer 10 is then formed, and the second covering insulation partial layer 11 is formed in FIG. 5F, the same method steps as in FIGS. 1J and 1K once again being carried out.

In accordance with FIG. 5F, however, in particular in the region of the trench contact DTC, in a trough in the second hard mask layer 5A, a second covering insulation partial layer 11 in the form of a TEOS silicon dioxide layer is likewise deposited by means of a CVD method.

Figure 5G:
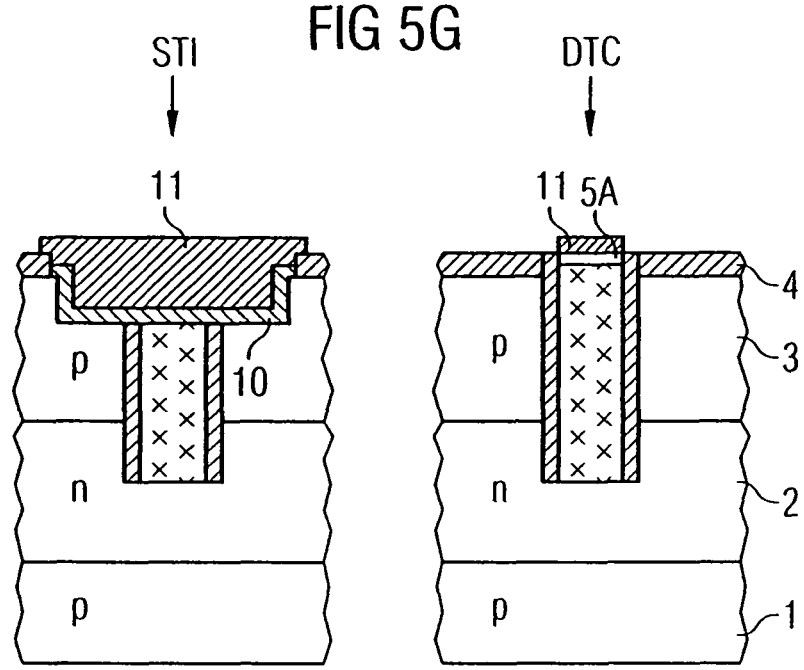
Figure 5H:
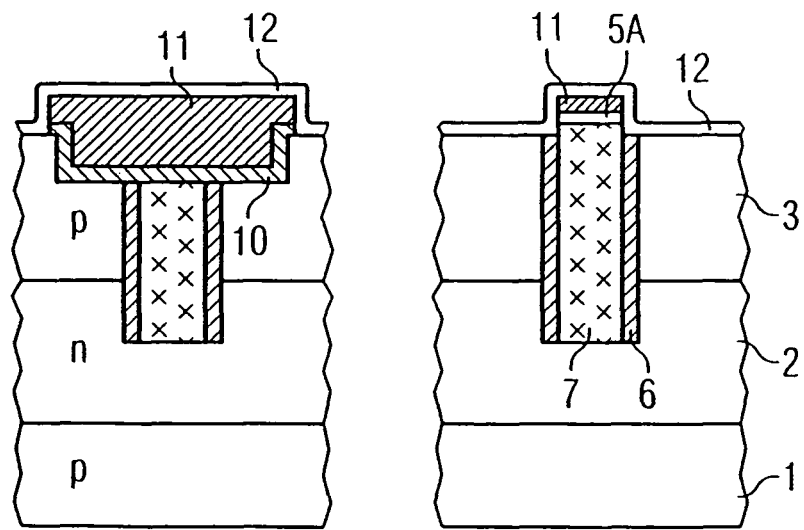

In accordance with FIG. 5G, the uncovered regions of the second hard mask layer 5A are then also completely removed, but a part of said layer 5A remains below the second covering insulation partial layer 11 in the region of the trench contact DTC.

Finally, in accordance with FIG. 5H, once again the first insulation layer 4 or the silicon dioxide buffer layer is completely removed and a gate dielectric 12 is formed over the whole area, a thermal oxidation preferably being carried out in order to form a conformal (uniformly thick) gate oxide.

The further steps for forming the doping regions, control layers and contact holes are not illustrated below, reference being made explicitly to the description of the first exemplary embodiment.

Accordingly, particularly when realizing a semiconductor component with a widened trench isolation STI which has a widened trench surface, the fabrication method can be slightly simplified, improved shielding properties with a reduced area requirement once again being obtained.

The multiple well structure illustrated in FIG. 5 may, of course, also be applied to other semiconductor substrates and other well structures in accordance with FIGS. 2 to 4.

Sixth Exemplary Embodiment

FIGS. 6A to 6E show simplified sectional views for illustrating essential method steps in the fabrication of a semiconductor component with trench isolation in accordance with a sixth exemplary embodiment, the trench isolation merely having a narrow trench isolation TTI.

Figure 6A:
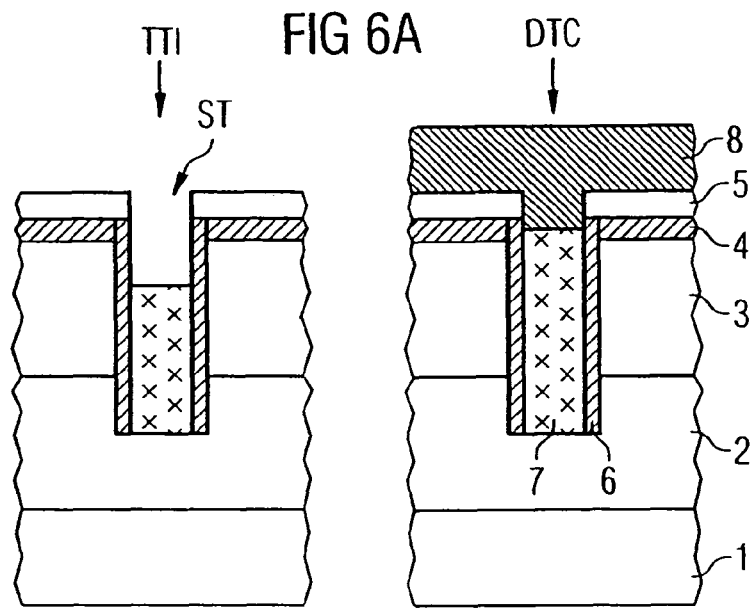
FIGS. 6A to 6E show simplified sectional views for illustrating essential method steps in the fabrication of a semiconductor component with trench isolation in accordance with a sixth exemplary embodiment.

In accordance with the sixth exemplary embodiment, firstly the method steps in accordance with FIGS. 1A to 1D are once again carried out, once again a first resist layer 8 for covering the regions for the trench contacts DTC being applied and patterned in a subsequent step in accordance with FIG. 6A. Accordingly, the regions for the narrow trench isolations TTI are etched using this resist layer 8, as a result of which an upper region is removed for example by means of an anisotropic etching method (RIE) of the trenches or the electrically conductive filling layer 7 situated therein. Consequently, the shallow trenches ST formed in the upper region of the trenches are once again obtained.

Figure 6B:
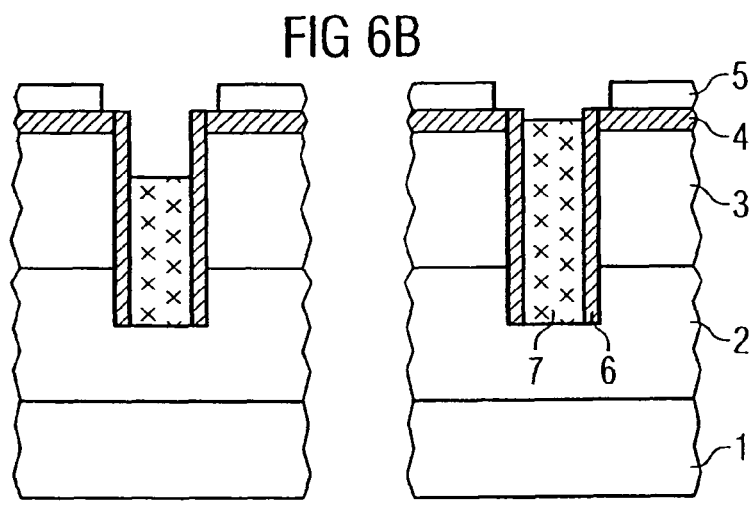

In accordance with FIG. 6B, in a subsequent method step, the first resist layer 8 is removed or a resist stripping is carried out and then the first hard mask layer 5 is etched back once again for stress relief of the trench edges.

Figure 6C:
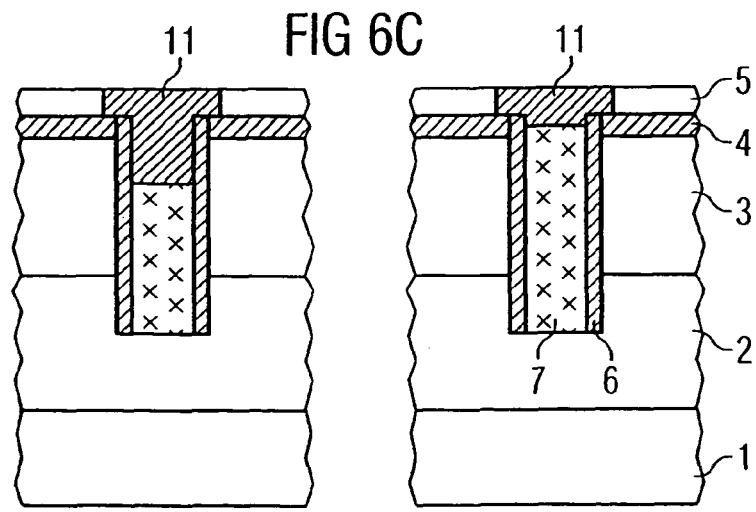

In accordance with FIG. 6C, afterward silicon dioxide is deposited preferably by means of a TEOS deposition method and is planarized by means of a chemical mechanical polishing method (CMP), the first hard mask layer 5 serving as a stop layer. The covering insulation layer 11 illustrated in FIG. 6C, which constitutes a single layer in the sixth exemplary embodiment, is obtained in this way.

Figure 6D:
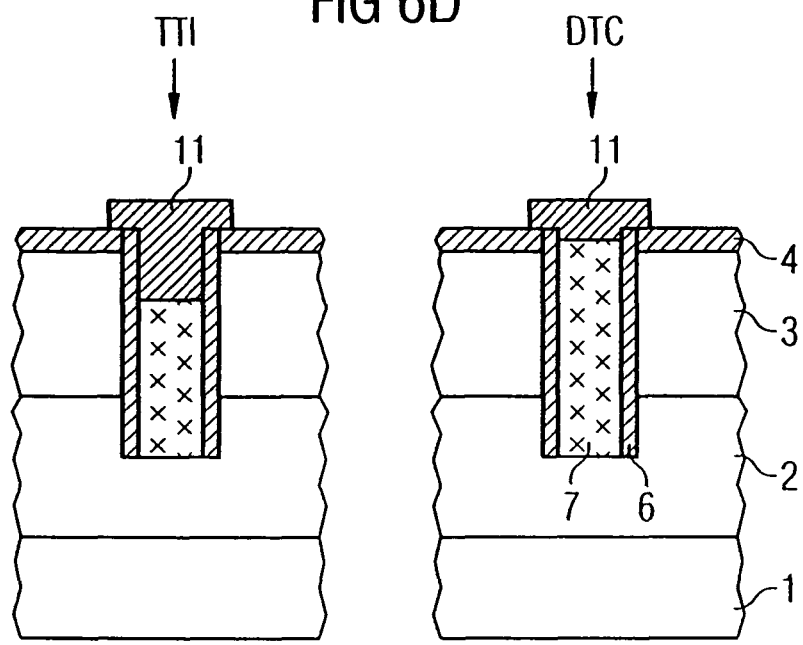
Figure 6E:
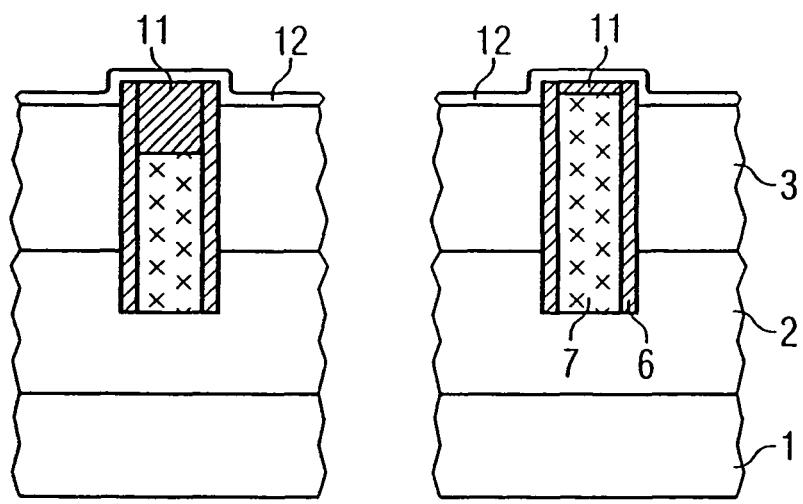

In accordance with FIG. 6D, in a subsequent method step, the first hard mask layer 5 is removed by means of conventional etching methods and, in accordance with FIG. 6E, the first insulation layer 4 or silicon dioxide buffer layer is eliminated over the whole area in the same way.

Finally, in accordance with FIG. 6E, a gate dielectric 12 is once again formed at the surface of the semiconductor substrate or the well 3, a thermal oxidation preferably being carried out in order to produce a gate oxide layer 12. The description of the further method steps that are still required is once again dispensed with below and, in particular, reference is made to the description of the first exemplary embodiment.

In this way, an outstanding shielding with low connection resistance and a greatly reduced area requirement and a highly flexible possibility of use is obtained in particular by virtue of the combination of a trench isolation that is contact-connected at the bottom side for the realization of an active shielding with a trench contact. In this case, the narrow or thin trench isolations TTI can be used for further improved integration densities, while the widened trench isolations STI with widened trenches in the upper region that are formed at the same time or as an alternative furthermore afford the possibility of deactivating large regions of the semiconductor substrate by means of proven standard methods.

In the case of multiple well structures, in particular, the wells now need no longer make contact with the semiconductor surface, but rather can be contact-connected directly. By way of example, a lateral insulation of an inner triple well can be achieved by means of a closed ring of the trench contact DTC. Furthermore, virtually every point within a well can additionally be contact-connected via a DTC in order that similar or identical potential conditions are produced in the entire well, as a result of which the characteristic properties of a semiconductor component can be improved further. Negative voltages, in particular, can thus be insulated in a particularly simple manner and be generated and switched on the chip.

The direct bottom-side contact-connection of the electrical shielding in the trench isolation furthermore makes it possible to disregard the relatively high lateral parasitic resistances of the wells, as a result of which the shielding is once again improved.

The invention has been described above using a p-doped semiconductor substrate. However, an n-doped semiconductor substrate can also be used in the same way, the doping used in the exemplary embodiments mentioned above being replaced by the complementary dopings.

The invention claimed is:

1. A semiconductor component with trench isolation for defining active regions in a semiconductor substrate, the trench isolation comprising:
   a deep isolation trench with a first covering insulation layer below a surface of the semiconductor substrate and a second covering insulation layer over the first covering insulation layer and above the surface of the semiconductor substrate, a gate oxide layer over a surface of the second covering insulation layer, a side wall insulation layer, an electrically conductive filling layer, which is electrically connected to a predetermined doping region of the semiconductor substrate in a bottom region of the deep isolation trench, and wherein the first covering insulation layer is over a top surface of the electrically conductive filling layer, and the sidewall insulation layer; and further comprising:
   a trench contact, which comprises:
   a deep contact trench with a side wall insulation layer and an electrically conductive filling layer which is electrically, contact-connected to the predetermined doping region of the semiconductor substrate in a bottom region of the contact trench;
   a trench contact insulation layer being only upon a surface of the electrically conductive filling layer; and
   a contact opening through the trench contact insulation layer and in contact with a top surface of the electrically conductive filling layer, and wherein a composition of the electrically conductive filling layer that is electrically, contact-connected to the predetermined doping region of the semiconductor substrate in a bottom region of the contact trench is the same as a composition of the electrically conductive filling layer having a top surface in contact with the contact opening.

2. The semiconductor component of claim 1, wherein the first covering insulation layer is within the deep isolation trench.

3. The semiconductor component of claim 1, wherein the trench isolation and the trench contact have a larger depth than an associated depletion zone in the semiconductor substrate.

4. The semiconductor component of claim 1, wherein the trench isolation further comprises a widened, shallow isolation trench at a surface of the semiconductor substrate configured for filling non-active regions.

5. The semiconductor component of claim 1, wherein the predetermined doping region comprises a doping well comprising a multiple well structure.

6. The semiconductor component of claim 1, wherein the semiconductor substrate comprises Si, the second covering insulation layer and side wall insulation layer comprise SiO2, and the electrically conductive filling layer comprises highly doped polysilicon.

* * * * *